United States Patent
Xing et al.

(10) Patent No.: US 9,214,946 B2
(45) Date of Patent: Dec. 15, 2015

(54) PHASE LOCKED LOOP CIRCUIT

(71) Applicant: Samsung Electronics Co., Ltd., Suwon-Si, Gyeonggi-Do (KR)

(72) Inventors: Nan Xing, Seoul (KR); Jaejin Park, Seongnam-si (KR); Jenlung Liu, Seoul (KR); Tae-Kwang Jang, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/108,834

(22) Filed: Dec. 17, 2013

(65) Prior Publication Data
US 2014/0191787 A1  Jul. 10, 2014

(30) Foreign Application Priority Data
Jan. 9, 2013  (KR) ........................ 10-2013-0002535

(51) Int. Cl.
*H03L 7/06* (2006.01)
*H03L 7/093* (2006.01)
*H03L 7/089* (2006.01)

(52) U.S. Cl.
CPC .............. *H03L 7/093* (2013.01); *H03L 7/0895* (2013.01)

(58) Field of Classification Search
CPC ....... H03L 7/1072; H03L 7/087; H03L 7/093; H03L 7/099; H03L 2207/50; H03L 7/085; H03L 7/0991
USPC .......................... 327/141, 155–159, 551–555
See application file for complete search history.

(56) References Cited

U.S. PATENT DOCUMENTS

| | | | |
|---|---|---|---|
| 5,005,016 A | 4/1991 | Schmidt et al. | |
| 5,978,425 A | 11/1999 | Takla | |
| 6,420,914 B1 | 7/2002 | Hasegawa | |
| 6,566,967 B1 * | 5/2003 | Anumula et al. | 331/11 |
| 6,614,319 B2 * | 9/2003 | Saeki et al. | 331/17 |

(Continued)

FOREIGN PATENT DOCUMENTS

JP    H10327069 A    12/1998

OTHER PUBLICATIONS

Michael H. Perrott, et al., "A 2.5-Gb/s Multi-Rate 0.25-m CMOS Clock and Data Recovery Circuit Utilizing a Hybrid Analog/Digital Loop Filter and All-Digital Referenceless Frequency Acquisition", IEEE Journal of Solid-State Circuits, vol. 41, No. 12, pp. 2930-2944, Dec. 2006.

Kyoungho Woo, et al., "Fast-Lock Hybrid PLL Combining Fractional-N and Integer-N Modes of Differing Bandwidths", IEEE Journal of Solid-State Circuits, vol. 43, No. 2, Feb. 2008.

Vlademir J.S. Oliveira, et al., "Frequency synthesizer using a hybrid analog/digital loop filter: A low complexity approach", International Journa l of Electronics and Communications, pp. 888-891, 2011.

(Continued)

*Primary Examiner* — Lincoln Donovan
*Assistant Examiner* — Diana J Cheng
(74) *Attorney, Agent, or Firm* — Harness, Dickey & Pierce, P.L.C.

(57) ABSTRACT

A phase locked loop circuit is provided which includes a bang-bang phase frequency detector configured to receive a reference signal and a feedback signal, detect a phase difference between the reference signal and the feedback signal, output a detection signal on the based on a result of the detection; an analog-digital mixed filter configured to receive the detection signal and output a control signal on the basis of the received detection signal; a voltage controlled oscillator configured to output an output signal in response to the control signal; and a divider configured to divide the output signal by n to output as the feedback signal. The detection signal is a digital signal, and the control signal is an analog signal.

20 Claims, 5 Drawing Sheets

(56) References Cited

U.S. PATENT DOCUMENTS

| | | |
|---|---|---|
| 6,686,784 B2 | 2/2004 | Chang |
| 7,999,586 B2 | 8/2011 | Lee et al. |
| 8,339,165 B2 | 12/2012 | Dunworth et al. |
| 8,704,566 B2 * | 4/2014 | Ainspan et al. ............... 327/158 |

OTHER PUBLICATIONS

Sooho Cha, et al., "A Phase-Locked Loop with Embedded Analog-to-Digital Converter for Digital Control", ETRI Journal, vol. 29, No. 4, pp. 463-469, Aug. 2007.

* cited by examiner

PHASE LOCKED LOOP CIRCUIT

CROSS-REFERENCE TO RELATED APPLICATIONS

This U.S. non-provisional patent application claims priority under 35 U.S.C. §119 of Korean Patent Application No. 10-2013-0002535, filed on Jan. 9, 2013, the entire contents of which are hereby incorporated by reference.

BACKGROUND

Example embodiments of the inventive concepts herein relate to a phase locked loop circuit, and more particularly, to a phase locked loop circuit using an analog-digital mixed filter.

When a signal is represented in a frequency domain, the signal is divided into a magnitude component indicating signal strength and a phase component indicating time characteristics. The phase component of the signal is easily changed since it is sensitive to an influence of a temperature or a peripheral circuit. For example, when a digital signal is transmitted, a signal delay may occur in a clock signal according to a signal path. When the signal delay occurs, a phase of the signal is changed. Therefore, a circuit may be required to perform synchronization on a phase of a clock signal.

A phase locked loop (PLL) circuit is a frequency feedback circuit stably outputting a certain frequency signal which is synchronized with a frequency of a signal input externally. The PLL circuit is widely used for analog or digital electronic circuit systems. For example, the PLL circuit may be used for stably providing an oscillating frequency of a local oscillation circuit in order to transmit and receive a signal in a wireless communication system, or for generating a stable reference clock signal required in digital signal processing of a digital circuit such as a microprocessor.

Recently, as a semiconductor integration technology is developed, a PLL circuit having a small area may be desired to be able to be included in a semiconductor chip. Accordingly, an all-digital phase locked loop is provided on the basis of a digital controlled oscillator operating in a digital scheme. However, since the digital controlled oscillator is sensitive to process, voltage, and temperature (PVT) variations, it becomes difficult to precisely control the PLL circuit, as a size of a semiconductor chip gets smaller.

SUMMARY

An embodiment of the inventive concepts provides a phase locked loop circuit capable of reducing costs and improving performance.

According to an example embodiment of the inventive concepts, a phase locked loop circuit comprises a bang-bang phase frequency detector configured to receive a reference signal and a feedback signal, detect a phase difference between the reference signal and the feedback signal, and output a detection signal based on the detected phase difference; an analog-digital mixed filter configured to receive the detection signal and output a control signal based on the received detection signal; a voltage controlled oscillator configured to output an output signal based on the control signal; and a divider configured to divide the output signal by n and output the divided signal as the feedback signal. The detection signal is a digital signal, and the control signal is an analog signal. The analog-digital filter includes a digital filter configured to filter the received detection signal to remove a noise; a delta-sigma modulator configured to output first and second signals based on the filtered detection signal; and an analog integrator configured to output the control signal based on the first and second signals. The analog integrator comprises a pulse generator configured to adjust pulse widths of the first and second signals and output pull-up and pull-down signals based on the adjusted pulse widths of first and second signals; and a charge pump array including a plurality of charge pumps and configured to output the control signal based on the pull-up and pull-down signals.

In exemplary embodiments, the pulse generator comprises a flip-flop configured to output a clock signal in response to the feedback signal and a reset signal; first to fourth transistors configured to be operated by the clock signal and serially connected between a power supply voltage node and a ground voltage node; and a capacitor connected between a source of the second transistor and the ground voltage node, the pulse generator being configured such that capacitor is charged and discharged according to operations of the first to fourth transistors. The reset signal is determined on the basis of a charged voltage of the capacitor.

In exemplary embodiments, a logic level of the reset signal becomes high when the charged voltage of the capacitor is a reference level or higher.

In exemplary embodiments, when the logical level of the reset signal is high, the flip-flop is reset.

In exemplary embodiments, the pull-up and pull-down signals respectively control pull-up circuits and pull-down circuits of the plurality of charge pumps included in the charge pump array.

In exemplary embodiments, when the pull-up signal is logic high, a pull-up circuit of at least charge pump from among the plurality of charge pumps is turned on and a level of the control signal is increased.

In exemplary embodiments, when a logic level of the pull-down signal is high, a pull-down circuit of at least one charge pump from among the plurality of charge pumps is turned on and the control signal is discharged.

In exemplary embodiments, each of the plurality of charge pumps comprises a current mirror configured to generate first and second currents; fifth to eighth transistors serially connected between the power supply voltage node and the ground voltage node; a first switch connected between a drain of the fifth transistor and the current mirror; a second switch connected between a source of the seventh transistor and the current mirror; a ninth transistor connected between the current mirror and the ground voltage node, the fifth transistor including a gate connected to a drain of the sixth transistor; and a tenth transistor connected between the current mirror and the ground voltage node, the tenth transistor including a gate connected to the current mirror. The first and second currents have a same magnitude.

In exemplary embodiments, the fifth and sixth transistors and the first switch operate based on the pull-up signal, and the seventh and eighth transistors and the second switch operate based on the pull-down signal.

In exemplary embodiments, each of the plurality of charge pumps further comprises an inverter connected to gate terminals of the fifth and sixth transistors. The inverter receives the pull-up signal, inverts the received pull-up signal, and outputs the inverted pull-up signal.

In exemplary embodiments, when a logical level of the the pull-up signal is high, the fifth and sixth transistors are turned on.

In exemplary embodiments, when the fifth and sixth transistors are turned-on, the control signal is charged to a reference level.

In exemplary embodiments, when a logic level of the pull-down signal is high, the seventh and eighth transistors are turned on.

In exemplary embodiments, when the seventh and eighth transistors are turned on, the control signal is discharged to a reference level.

According to another exemplary embodiment of the inventive concepts, a phase locked loop circuit comprises a bang-bang phase frequency detector configured to receive a reference signal and a feedback signal, detect a phase difference between the reference signal and the feedback signal, and generate a detection signal based on the detected phase difference; a pulse generator configured to generate a clock signal based on the feedback signal, and generate pull-up and pull-down signals based on the detection signal, pulse widths of the pull-up and pull-down signals being based on a pulse width of the clock signal; a charge pump array including a plurality of charge pumps, the charge pump array being configured to receive the pull-up and pull-down signals and generate a control signal based on the pull-up and pull-down signals; a voltage controlled oscillator configured to receive the control signal and generate an output signal such that a frequency of the output signal is based on a level of the control signal; and a divider configured to perform a division operation on the output signal and output the feedback signal based on the division operation.

In exemplary embodiments, the detection signal is a digital signal, and the control signal is an analog signal.

In exemplary embodiments, the phase locked loop circuit further comprises a digital filter configured to remove noise from the detection signal by filtering the detection signal, and configured to output the filtered detection signal, the phase locked loop circuit being configured such that pull-up and pull-down signals generated by the pulse generator are generated based on the filtered detection signal.

In exemplary embodiments, the phase locked loop circuit further comprises an analog integrator configured to generate the control signal based on the filtered detection signal, the pulse generator and the charge pump array being included in the analog integrator.

In exemplary embodiments, the phase locked loop circuit further comprises an analog-digital mixed filter configured to generate the control signal based on the detection signal, the analog-digital mixed filter including the digital filter and the analog integrator.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Example embodiments of the inventive concepts will be described more fully hereinafter with reference to the accompanying drawings. Like reference numerals may refer to like elements throughout the accompanying drawings. Example embodiments may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the inventive concepts.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
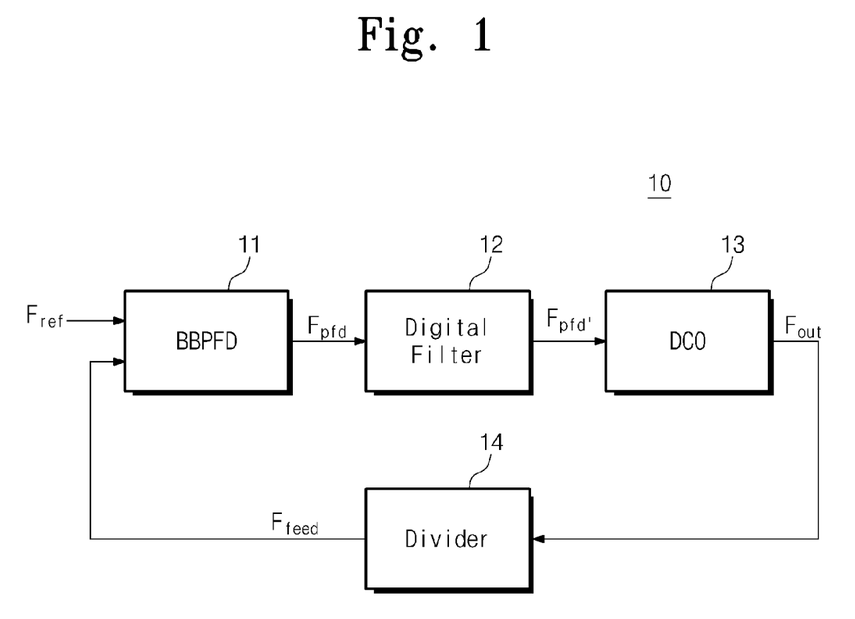
FIG. 1 is a block diagram illustrating an all-digital phase locked loop circuit.

FIG. 1 is a block diagram illustrating an all-digital phase locked loop circuit (ADPLL) 10. Referring to FIG. 1, the ADPLL 10 includes a bang-bang phase frequency detector (BBPFD) 11, a digital filter 12, a digital controlled oscillator (DCO) 13 and a divider 14. The ADPLL 10 outputs an output signal $F_{out}$ having a uniform frequency by performing synchronization on a phase of the output signal $F_{out}$.

The BBPFD 11 compares frequencies and phases of a reference signal $F_{ref}$ and a feedback signal $F_{feed}$ to output a detection signal $F_{pfd}$. For example, when the reference signal $F_{ref}$ leads the feedback signal $F_{feed}$, the BBPFD 11 outputs a logic high signal. On the contrary, when the reference signal $F_{ref}$ lags the feedback signal $F_{feed}$, the BBPFD 11 outputs a logic low signal. Thus, the BBPFD 11 outputs a digital signal as a detection signal $F_{pfd}$. For exemplary embodiments, the feedback signal $F_{feed}$ may be a signal that results from dividing an output signal $F_{out}$ by n, n being, for example, a positive integer. For exemplary embodiments, the reference signal $F_{ref}$ may be generated by a crystal oscillator.

The digital filter 12 receives the detection signal $F_{pfd}$ to perform a filtering operation. For example, the detection signal $F_{pfd}$ may include a noise. The digital filter 12 may filer the detection signal $F_{pfd}$ to remove a noise in the detection signal $F_{pfd}$.

The digital controlled oscillator 13 may output the output signal $F_{out}$ on the basis of the signal $F_{pfd}'$, which is a filtered version of the detection signal $F_{pfd}$. For example, the digital controlled oscillator 13 may adjust a frequency of an output signal $F_{out}$ on the basis of the filtered detection signal $F_{pfd}'$. When the filtered detection signal $F_{pfd}'$ is logic high, the digital controlled oscillator 13 may increase a frequency of the output signal $F_{out}$ by a predetermined or, alternatively, reference level. On the contrary, when the filtered detection signal $F_{pfd}'$ is logic low, the digital controlled oscillator 13 may decrease a frequency of the output signal $F_{out}$ by a predetermined or, alternatively, reference level.

The divider 14 may receive the output signal $F_{out}$. The divider 14 divides the received output signal $F_{out}$ by n and outputs as the feedback signal $F_{feed}$.

The ADPPL 10 repetitively performs the above described operations to output an output signal $F_{out}$ having a fixed phase and frequency. However, since the digital controlled oscillator is sensitive to process, voltage, and temperature (PVT) variations, it may be difficult to precisely control the frequency and phase of the output signal $F_{out}$.

Figure 2:
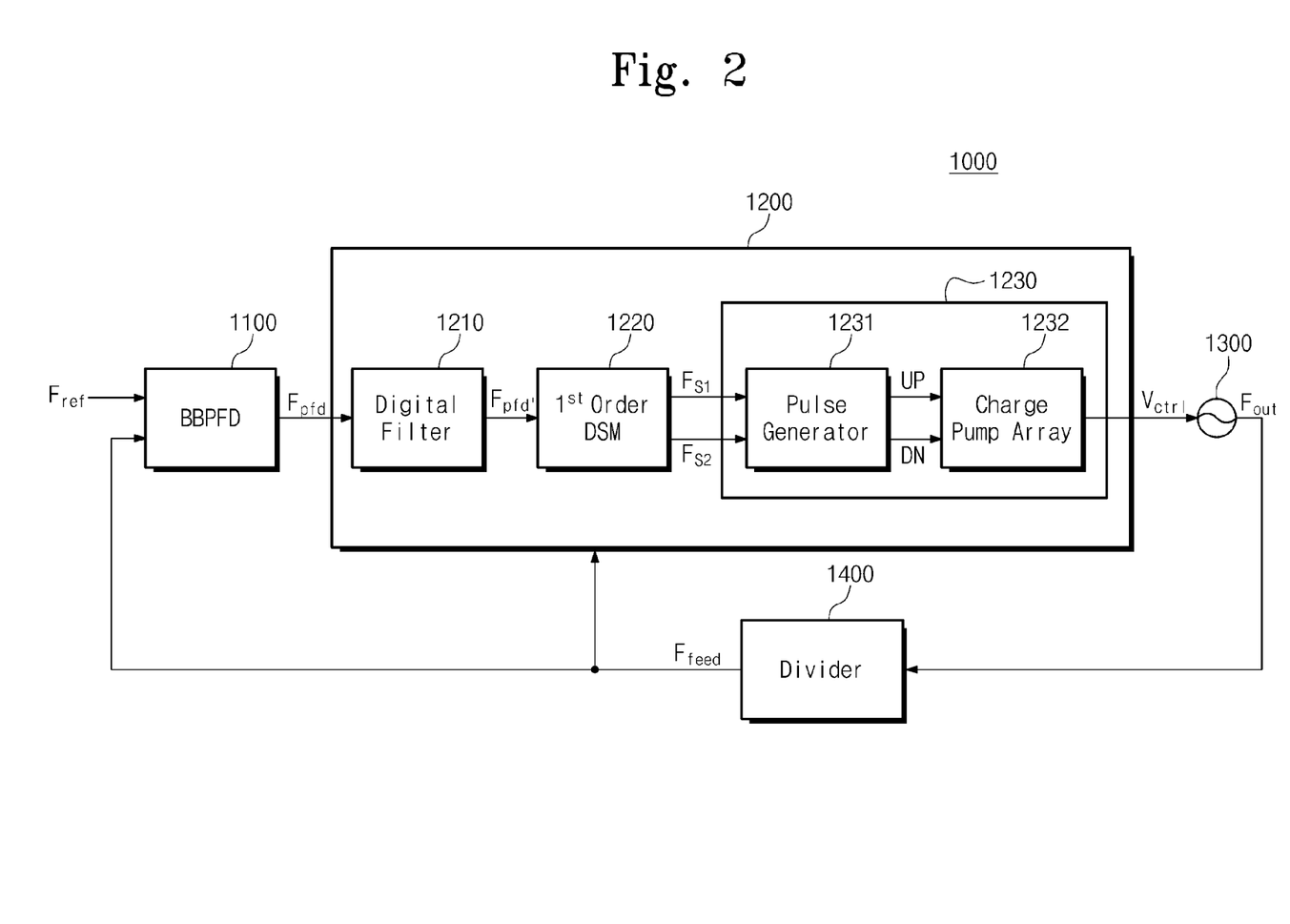
FIG. 2 is a block diagram illustrating a phase locked loop (PLL) circuit according to an embodiment of the inventive concepts.

FIG. 2 is a block diagram illustrating a PLL circuit 1000 according to an embodiment of the inventive concepts. Referring to FIG. 2, the PLL circuit 1000 includes a BBPFD 1100, an analog-digital mixed filter 1200, a voltage controlled oscillator (VCO) 1300, and a divider 1400. For example, compared with the ADPLL 10 in FIG. 1, the PLL circuit 1000 in FIG. 2 includes an analog-digital mixed filter 1200, and the VCO 1300.

The BBPFD 1100 receives the reference signal $F_{ref}$ and the feedback signal $F_{feed}$, and compares frequencies and phases of the received reference signal $F_{ref}$ and the feedback signal $F_{feed}$ to output the detection signal $F_{pfd}$. For example, when the reference signal $F_{ref}$ leads the feedback signal $F_{feed}$, the BBPFD 1100 outputs a logic high signal. On the contrary, when the reference signal $F_{ref}$ lags the feedback signal $F_{feed}$, the BBPFD 1100 outputs a logic low signal. Thus, the BBPFD 1100 outputs the detection signal $F_{pfd}$ as a digital signal.

The analog-digital mixed filter 1200 includes a digital filter 1210, a first order delta-sigma modulator (DSM) 1220, and an analog integrator 1230. The analog-digital mixed filter 1200 receives the detection signal $F_{pfd}$ from the BBPFD 1100, and outputs a control signal $V_{ctrl}$ on the basis of the received detection signal $F_{pfd}$. For exemplary embodiments, the control signal $V_{ctrl}$ may be an analog signal. For exemplary embodiments, the analog-digital mixed filter 1200 may receive the feedback signal $F_{feed}$. The received feedback signal $F_{feed}$ may be transmitted to the analog integrator 1230.

The digital filter 1210 may receive the detection signal $F_{pfd}$ from the BBPFD 1100 to perform a filtering operation. For example, the digital filter 1210 filters the received detection signal $F_{pfd}$ to remove a noise included in the detection signal $F_{pfd}$. For example, the digital filter 1210 may include a proportional-differential (PD) filter.

The first-order DSM 1220 outputs first and second signals $F_{s1}$ and $F_{s2}$ on the basis of the filtered detection signal $F_{pfd'}$. For example, when the filtered detection signal $F_{pfd'}$ is logic high, the first signal $F_{s1}$ may be logic high, and the second signal $F_{s2}$ may be logic low. On the contrary, when the filtered detection signal $F_{pfd'}$ is logic low, the first signal $F_{s1}$ may be logic low, and the second signal $F_{s2}$ may be logic high.

The analog integrator 1230 receives the first and second signals $F_{s1}$ and $F_{s2}$ from the first-order DSM 1220. The analog integrator 1230 includes the pulse generator 1231 and a charge pump array 1232. The pulse generator 1231 may generate a clock signal CLK having a predetermined or, alternatively, reference pulse width $T_{on}$ at a rising edge of the feedback signal $F_{feed}$. For exemplary embodiments, in order that the first and second signals $F_{s1}$ and $F_{s2}$ have the pulse width $T_{on}$, the pulse generator 1231 may adjust pulse widths of the first and second signals $F_{s1}$ and $F_{s2}$ to output a pull-up signal (UP) and a pull-down signal (DN). An operation of the pulse generator 1231 will be described in detail with reference to FIGS. 3 and 5.

The charge pump array 1232 includes a plurality of charge pumps. The charge pump array 1232 receives the pull-up and pull-down signals UP and DN output from the pulse generator 1231 to output as a control signal $V_{ctrl}$. For example, when the pull-up signal UP is logic high, a pull-up circuit of any one among charge pumps included in the charge-pump array 1232 is turned on, and the control signal $V_{ctrl}$ is charged as much as a predetermined level. On the contrary, when the pull-down signal DN is logic high, a pull-down circuit of any one among the charge pumps included in the charge-pump array 1232 is turned on, and the control signal $V_{ctrl}$ is discharged as much as a predetermined level. A voltage level adjusting method of the control signal $V_{ctrl}$ will be described in detail with reference to FIG. 5.

The VCO 1300 may output an output signal $F_{out}$ on the basis of the control signal $V_{ctrl}$. For example, the VCO 1300 outputs an output signal $F_{out}$ of a higher frequency as a voltage level of the control signal $V_{ctrl}$ is higher. Thus, an output frequency of the VCO 1300 has a proportional relationship in a constant proportion with a voltage of the control signal $V_{ctrl}$. For exemplary embodiments, the VCO 1300 may include an automatic frequency control (AFC) circuit. When the PLL circuit 1000 is reset, the AFC circuit may perform an operation of adjusting a gain of the VCO 1300. Thus, the AFC circuit operates to allow an output signal of the VCO 1300 to have a uniform frequency during an initial operation of the PLL circuit 1000.

The divider 1400 receives an output signal $F_{out}$, and divides a frequency of the received output signal $F_{out}$ by n to output as a feedback signal $F_{feed}$. For example, n may be determined on the basis of the reference signal $F_{ref}$ and a target frequency of the output signal $F_{out}$.

The PLL circuit 1000 of an embodiment of the inventive concepts controls the VCO 1300 through the analog-digital mixed filter 1200 to perform synchronization on a phase of the output signal $F_{out}$ and allow the output signal $F_{out}$ to have a uniform frequency. Accordingly, the PLL circuit having improved performance and reduced cost is provided.

Figure 3:
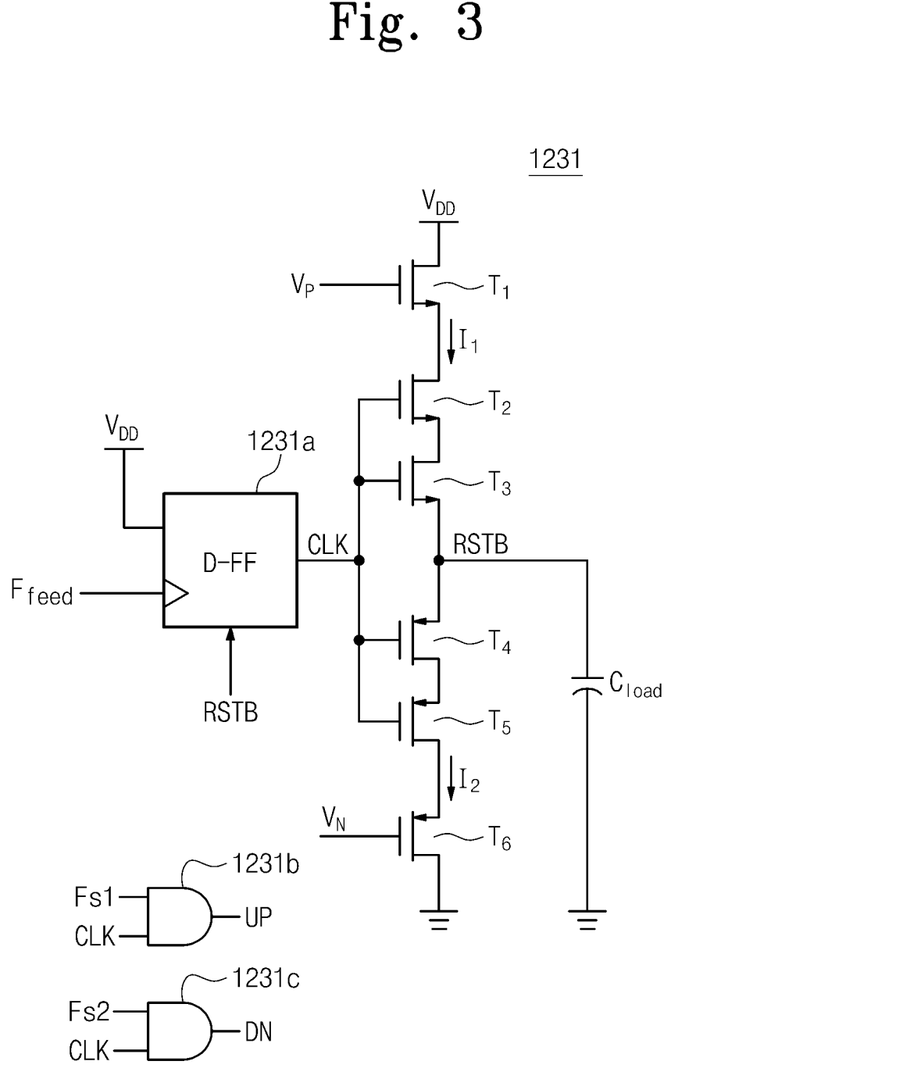
FIG. 3 is a circuit diagram illustrating an operation of a pulse generator according to an embodiment of the inventive concepts.

FIG. 3 is a circuit diagram illustrating an operation of the pulse generator 1231 according to an embodiment of the inventive concepts. Referring to FIG. 3, the pulse generator 1231 includes a flip-flop 1231a, first to sixth transistors T1 to T6, and a capacitor $C_{load}$. According to at least one example embodiment of the inventive concepts, first to third transistors T1-T3 may be N-channel metal-oxide-silicon (NMOS) transistors and fourth to sixth T4-T6 transistors may be P-channel metal-oxide-silicon (PMOS) transistors.

The flip-flop 1231a may receive a supply voltage $V_{DD}$ as an input to a data terminal of the flip-flop 1231a and receive the feedback signal $F_{feed}$ as in input to a clock terminal of the flip-flop 1231a to output a clock signal CLK. The clock signal CLK is a signal having a predetermined or, alternatively, reference pulse width $T_{on}$. For example, the flip-flop 1231a may receive the feedback signal $F_{feed}$. When the received feedback signal $F_{feed}$ is logic high, the second and third transistors T$_2$ and T$_3$ become turned on. In this case, a charged voltage of the capacitor $C_{load}$ increases. When the charged voltage of the capacitor $C_{load}$ becomes a predetermined level or higher, a reset signal RSTB becomes logic high. The flip-flop 1231a is reset in response to the reset signal RSTB. In this case, the third and fourth transistors T$_3$ and T$_4$ are turned on, and the charged voltage of the capacitor $C_{load}$ discharges through the fourth to sixth transistors T$_4$ to T$_6$. Consequently, the flip-flop 1231a outputs a clock signal CLK having a pulse width $T_{on}$. The pulse width $T_{on}$ of the clock signal CLK may be the same as equation 1.

$$T_{on} = \frac{(\Delta V)C_{load}}{I_1}, \quad (1)$$

where $T_{on}$ denotes a pulse width of the clock signal CLK, $\Delta V$ denotes a changed amount of the charged voltage of the capacitor $C_{load}$ of the pulse generation 1231, $C_{load}$, as used in equation (1), denotes electrostatic capacity of the capacitor $C_{load}$ of the pulse generation 1231, and $I_1$ denotes a current value flowing through the first to third transistors $T_1$ to $T_3$. For example, the capacitor $C_{load}$ is charged with $I_1$. FIG. 3 also illustrates a current $I_2$ flowing through fourth to sixth transistors $T_4$ to $T_6$. Further, the gates of the first and sixth transistors T1 and T6 may be connected to voltages $V_P$ and $V_N$ respectively.

In exemplary embodiments, the pulse generator 1231 further includes first and second logic units 1231b and 1231c. The first and second logic units 1231b and 1231c may be an AND-gate. The first and second logic units 1231b and 1231c receive the clock signal CLK and the first and second signals Fs1 and Fs2 to output the pull-up and pull-down signals PN and DN. For example, the first logic unit 1231b receives the first signal Fs1 from the first order delta-sigma modulator 1220 and the clock signal CLK from the flip-flop 1231a. The first logic unit 1231b performs a logical AND operation for the received signals Fs1 and CLK to output the pull-up signal UP. The second logic unit 1231c receives the second signal Fs2 from the first order delta-sigma modulator 1220 and the clock signal CLK from the flip-flop 1231a. The first logic unit 1231c performs a logical AND operation for the received signals Fs2 and CLK to output the pull-down signal DN.

Figure 4:
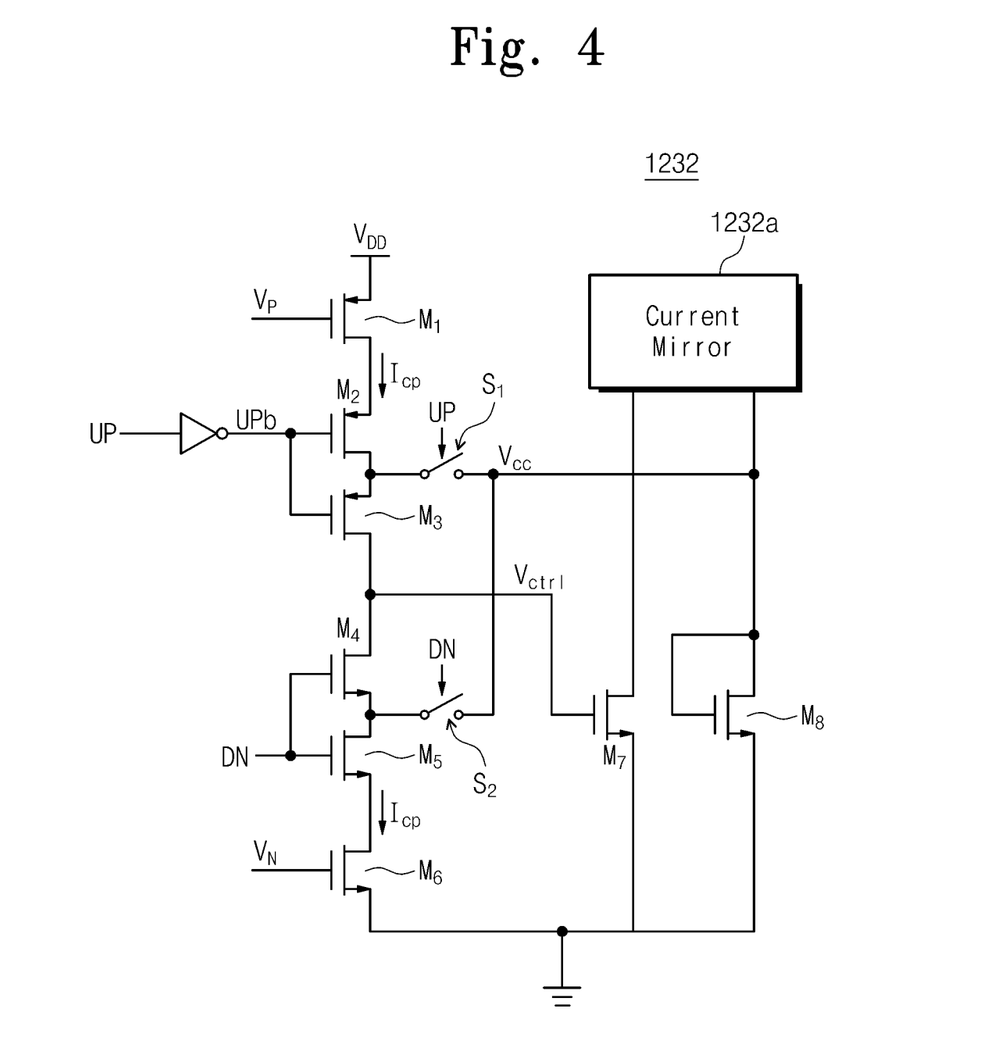
FIG. 4 is a circuit diagram illustrating a charge pump according to an embodiment of the inventive concepts.

FIG. 4 illustrates a charge pump array 1232 according to an embodiment of the inventive concepts. For example, the charge pump array 1232 illustrated in FIG. 4 includes a single charge pump configuration. But a scope of an embodiment of the inventive concepts is not limited thereto, and the charge pump array 1232 may include a plurality of charge pump units having the charge pump configuration illustrated in FIG. 4.

Referring to FIG. 4, the charge pump array 1232 includes first to eighth transistors $M_1$ to $M_8$, first and second switches $S_1$ and $S_2$, and a current mirror 1232a. The current mirror 1232a provides the same magnitude of currents to the seventh and eighth transistors $M_7$ and $M_8$. In other words, gate voltages provided to the seventh and eighth transistors $M_7$ and $M_8$ may be the same. According to at least one example embodiment of the inventive concepts, first through third transistors $M_1$-$M_3$ may be PMOS transistors and fourth through eight transistors $M_4$-$M_8$ may be NMOS transistors. A voltage provided to a gate of the seventh transistor $M_7$ is the control signal $V_{ctrl}$. Accordingly, the control signal $V_{ctrl}$ may be the same as a voltage $V_{cc}$ provided to a gate of the eighth transistor $M_8$.

A source of the first transistor $M_1$ is connected to a power supply voltage $V_{DD}$, a drain of the first transistor $M_1$ is connected to a source of the second transistor $M_2$. A drain of the second transistor $M_2$ is connected to a source of the third transistor $M_3$ and the first switch $S_1$. A drain of the third transistor $M_3$ is connected to a drain of the fourth transistor $M_4$ and a gate of the seventh transistor $M_7$. A source of the fourth transistor $M_4$ is connected to the second switch $S_2$ and a drain of the fifth transistor $M_5$. A source of the fifth transistor $M_5$ is connected to a drain of the sixth transistor $M_6$. The first and second switches $S_1$ and $S_2$ may be operated by the pull-up and pull-down signals UP and DN. Further, the gates of the first and sixth transistors T1 and T6 may be connected to voltages $V_P$ and $V_N$ respectively.

The second and third transistors $M_2$ and $M_3$ are operated by an inverted pull-up signal UPb. The fourth and fifth transistors $M_4$ and $M_5$ are operated by a pull-down signal DN. For example, when the pull-up signal UP is logic low and the pull-down signal DN is logic high, the second and third transistors are turned off, and the fourth and fifth transistors $M_4$ and $M_5$ are turned on. A charging current $I_{cp}$ flows through the fourth to sixth transistors $M_4$ to $M_6$, and the control signal $V_{ctrl}$ may be discharged as much as a predetermined or, alternatively, reference level. At this time, the first switch $S_1$ is turned on, and the second switch $S_2$ is turned off. Since the current mirror 1232a provides the same current to the seventh and eight transistors $M_7$ and $M_8$, the control signal $V_{ctrl}$ and a gate signal $V_{CC}$ may be the same. In other words, a voltage difference between the drain and the source of the third transistor $M_3$ becomes 0, substantially. Thus, according to at least one example embodiment of the inventive concepts, the first switch S1 it turned on thus allowing a current to pass between terminals of the switch S1 when the pull-up signal UP is low, and the second switch S2 it turned off thus preventing a current from passing between terminals of the second switch S2 when the pull-down signal DN is high.

On the contrary, when the pull-up signal UP is logic high and the pull-down signal DN is logic low, the second and third transistors $M_2$ and $M_3$ are turned on, and the fourth and fifth transistors $M_4$ and $M_5$ are turned off. In this case, a charging current $I_{cp}$ flows through the first to third transistors $M_1$ to $M_3$, and the control signal $V_{ctrl}$ may be charged as much as a predetermined or, alternatively, reference level. At this time, the first switch $S_1$ is turned off, and the second switch $S_2$ is turned on. Since the current mirror 1232a provides the same current to the seventh and eight transistors $M_7$ and $M_8$, the control signal $V_{ctrl}$ and a gate signal $V_{CC}$ may be the same. In other words, a voltage difference between the drain and the source of the fourth transistor $M_4$ becomes 0. Thus, according to at least one example embodiment of the inventive concepts, the first switch S1 it turned off thus preventing a current from passing between terminals of the first switch S1 when the pull-up signal UP is high, and the second switch S2 it turned on thus allowing a current to pass between terminals of the second switch S2 when the pull-down signal DN is low.

For the above-described cases, since the first or second switch $S_1$ or $S_2$ is turned on or off, voltage differences between the drains and the sources of the third and fourth transistors $M_3$ and $M_4$ become 0. In other words, a leak current leaked from the control signal $V_{ctrl}$ becomes reduced. Due to this, the change amount of the control signal $V_{ctrl}$ becomes reduced so that reliability of the control signal $V_{ctrl}$ is improved.

Figure 5:
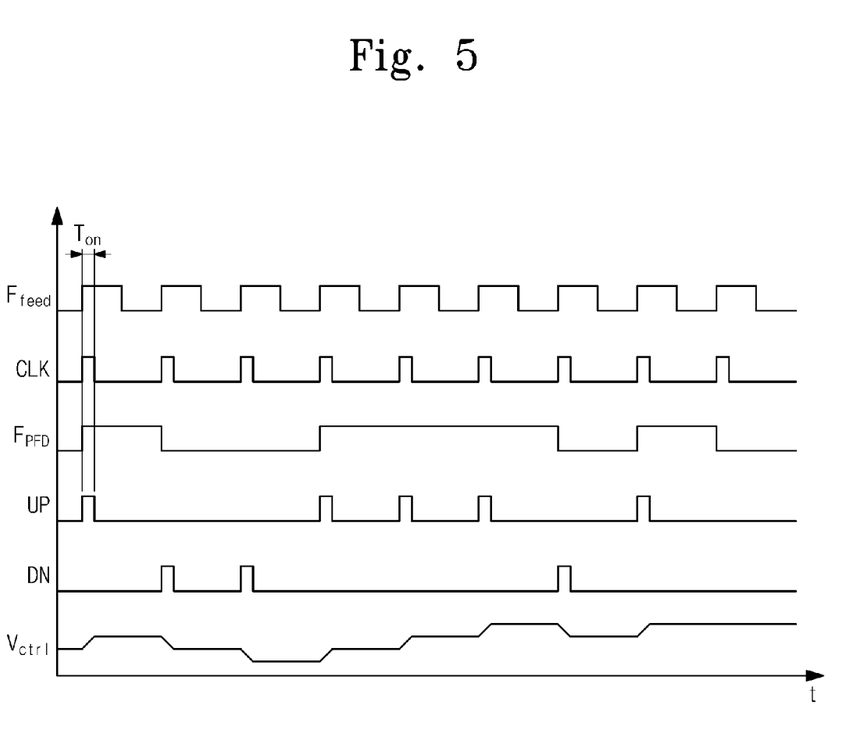
FIG. 5 is a timing diagram illustrating an operation of a PLL circuit according to an embodiment of the inventive concepts.

FIG. 5 is a graph illustrating an operation of the PLL circuit 1000 according to an embodiment of the inventive concepts. For example, an X axis in FIG. 5 denotes time and an Y axis in FIG. 5 denotes signal level.

Referring to FIGS. 2 and 5, the PLL circuit 1000 may adjust the pulse width $T_{on}$ of the clock signal CLK to adjust the control signal $V_{ctrl}$. For example, the PLL circuit 1000 may generate the clock signal CLK having a predetermined pulse width $T_{on}$. The PLL circuit 1000 may compare the detection signal $F_{pfd}$ and the clock signal CLK to generate the pull-up and pull-down signals UP and DN. The pull-up signal UP controls a pull-up circuit of the charge pump array 1232. The pull-down signal DN controls the pull-down circuits of the charge pump array 1232. That is, the control signal $V_{ctrl}$ may be charged or discharged during a time as much as the pulse width $T_{on}$ of the pull-up and pull-down signals UP and DN.

The PLL circuit according to an embodiment of the inventive concepts has a simpler configuration than a digital PLL circuit by using an analog-digital mixed filter. In addition, improved performance of the PLL circuit can be also provided by using an analog-digital mixed filer and a VCO instead of the digital controlled oscillator which is sensitive to PVT variations. Accordingly, a PLL circuit having reduced costs and improved performance is provided.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A phase locked loop circuit comprising:
   a bang-bang phase frequency detector configured to receive a reference signal and a feedback signal, detect a phase difference between the reference signal and the feedback signal, and output a detection signal based on the detected phase difference;
   an analog-digital mixed filter configured to receive the detection signal and output a control signal based on the received detection signal;
   a voltage controlled oscillator configured to output an output signal based on the control signal; and
   a divider configured to divide the output signal by n and output the divided signal as the feedback signal,
   wherein the detection signal is a digital signal, and the control signal is an analog signal; and
   wherein the analog-digital filter includes,
      a digital filter configured to filter the received detection signal to remove noise,
      a delta-sigma modulator configured to output first and second signals based on the filtered detection signal, and
      an analog integrator configured to output the control signal based on the first and second signals,
      wherein the analog integrator includes,
         a pulse generator configured to adjust pulse widths of the first and second signals and output pull-up and pull-down signals based on the adjusted pulse widths of the first and second signals; and
         a charge pump array including a plurality of charge pumps and configured to output the control signal based on the pull-up and pull-down signals.

2. The phase locked loop circuit of claim 1, wherein the pulse generator comprises:
   a flip-flop configured to output a clock signal in response to the feedback signal and a reset signal;
   first to fourth transistors configured to be operated by the clock signal and serially connected between a power supply voltage node and a ground voltage node; and
   a capacitor connected between a source of the second transistor and the ground voltage node, the pulse generator being configured such that the capacitor is charged and discharged according to operations of the first to fourth transistors,
   wherein the reset signal is determined on the basis of a charged voltage of the capacitor.

3. The phase locked loop circuit of claim 2, wherein a logic level of the reset signal becomes high when the charged voltage of the capacitor is a reference level or higher.

4. The phase locked loop circuit of claim 3, wherein, when the logic level of the reset signal is high, the flip-flop is reset.

5. The phase locked loop circuit of claim 1, wherein the pull-up and pull-down signals respectively control pull-up circuits and pull-down circuits of the plurality of charge pumps included in the charge pump array.

6. The phase locked loop circuit of claim 5, wherein, when the pull-up signal is logic high, a pull-up circuit of at least one charge pump from among the plurality of charge pumps is turned on and a level of the control signal is increased.

7. The phase locked loop circuit of claim 5, wherein, when a logic level of the pull-down signal is high, a pull-down circuit of at least one charge pump from among the plurality of charge pumps is turned on and the control signal is discharged.

8. The phase locked loop circuit of claim 4, wherein each of the plurality of charge pumps comprises:
   a current mirror configured to generate first and second currents;
   fifth to eighth transistors serially connected between the power supply voltage node and the ground voltage node;
   a first switch connected between a drain of the fifth transistor and the current mirror;
   a second switch connected between a source of the seventh transistor and the current mirror;
   a ninth transistor connected between the current mirror and the ground voltage node, the fifth transistor including a gate connected to a drain of the sixth transistor; and a tenth transistor connected between the current mirror and the ground voltage node, the tenth transistor including a gate connected to the current mirror, wherein the first and second currents have a same magnitude.

9. The phase locked loop circuit of claim 8, wherein the fifth and sixth transistors and the first switch operate based on the pull-up signal, and the seventh and eighth transistors and the second switch operate on based on the pull-down signal.

10. The phase locked loop circuit of claim 9, wherein each of the plurality of charge pumps further comprises:

an inverter connected to gate terminals of the fifth and sixth transistors, wherein the inverter receives the pull-up signal, inverts the received pull-up signal, and outputs the inverted pull-up signal.

11. The phase locked loop circuit of claim 10, wherein, when a logic level of the pull-up signal is high, the fifth and sixth transistors are turned on.

12. The phase locked loop circuit of claim 11, wherein, when the fifth and sixth transistors are turned-on, the control signal is charged to a reference level.

13. The phase locked loop circuit of claim 9, wherein, when a logic level of the pull-down signal is high, the seventh and eighth transistors are turned on.

14. The phase locked loop circuit of claim 13, wherein, when the seventh and eight transistors are turned on, the control signal is discharged to a reference level.

15. A phase locked loop circuit comprising:

a bang-bang phase frequency detector configured to receive a reference signal and a feedback signal, detect a phase difference between the reference signal and the feedback signal, and generate a detection signal based on the detected phase difference;

a pulse generator configured to generate a clock signal based on the feedback signal, and generate pull-up and pull-down signals based on the detection signal, pulse widths of the pull-up and pull-down signals being based on a pulse width of the clock signal;

a charge pump array including a plurality of charge pumps, the charge pump array being configured to receive the pull-up and pull-down signals and generate a control signal based on the pull-up and pull-down signals;

a voltage controlled oscillator configured to receive the control signal and generate an output signal such that a frequency of the output signal is based on a level of the control signal; and a divider configured to perform a division operation on the output signal and output the feedback signal based on the division operation.

16. The phase locked loop circuit of claim 15, wherein the detection signal is a digital signal, and the control signal is an analog signal.

17. The phase locked loop circuit of claim 15, further comprising:

a digital filter configured to remove noise from the detection signal by filtering the detection signal, and configured to output the filtered detection signal, the phase locked loop circuit being configured such that pull-up and pull-down signals generated by the pulse generator are generated based on the filtered detection signal.

18. The phase locked loop circuit of claim 17, further comprising:

an analog integrator configured to generate the control signal based on the filtered detection signal, the pulse generator and the charge pump array being included in the analog integrator.

19. A phase locked loop circuit comprising:

a bang-bang phase frequency detector configured to receive a reference signal and a feedback signal, detect a phase difference between the reference signal and the feedback signal, and generate a detection signal based on the detected phase difference;

a pulse generator configured to generate a clock signal based on the feedback signal, and generate pull-up and pull-down signals based on the detection signal, pulse widths of the pull-up and pull-down signals being based on a pulse width of the clock signal;

a charge pump array including a plurality of charge pumps, the charge pump array being configured to receive the pull-up and pull-down signals and generate a control signal based on the pull-up and pull-down signals;

a voltage controlled oscillator configured to receive the control signal and generate an output signal such that a frequency of the output signal is based on a level of the control signal;

a divider configured to perform a division operation on the output signal and output the feedback signal based on the division operation;

a digital filter configured to remove noise from the detection signal by filtering the detection signal, and configured to output the filtered detection signal, the phase locked loop circuit being configured such that pull-up and pull-down signals generated by the pulse generator are generated based on the filtered detection signal;

an analog integrator configured to generate the control signal based on the filtered detection signal, the pulse generator and the charge pump array being included in the analog integrator; and an analog-digital mixed filter configured to generate the control signal based on the detection signal, the analog-digital mixed filter including the digital filter and the analog integrator.

20. The phase locked loop circuit of claim 15, further comprising:

a delta-sigma modulator configured to output first and second signals based on the detection signal, wherein the pulse generator is configured to, generate the pull-up signal by performing a first OR operation, and generate the pull-down signal by performing a second OR operation, the first OR operation being performed based on the clock signal and the first signal, the second OR operation being performed based on the clock signal and the second signal.

* * * * *